(12) United States Patent
Piechulla et al.

(10) Patent No.: US 8,460,468 B2
(45) Date of Patent: Jun. 11, 2013

(54) DEVICE FOR DOPING, DEPOSITION OR OXIDATION OF SEMICONDUCTOR MATERIAL AT LOW PRESSURE

(75) Inventors: Alexander Piechulla, Blaubeuren (DE); Claus Rade, Allmendingen (DE); Robert Michael Hartung, Blaubeuren (DE)

(73) Assignee: Centrotherm Photovoltaics AG, Blaubeuren (DE)

( * ) Notice: Subject to any disclaimer, the term of this patent is extended or adjusted under 35 U.S.C. 154(b) by 0 days.

(21) Appl. No.: 13/564,126

(22) Filed: Aug. 1, 2012

(65) Prior Publication Data

US 2013/0025539 A1    Jan. 31, 2013

Related U.S. Application Data

(63) Continuation of application No. 12/124,445, filed on May 21, 2008, now abandoned.

(30) Foreign Application Priority Data

May 21, 2007   (DE) .......................... 10 2007 023 812
Dec. 28, 2007  (DE) .......................... 10 2007 063 363

(51) Int. Cl.
| C23C 16/455 | (2006.01) |
| C23F 1/00   | (2006.01) |
| H01L 21/306 | (2006.01) |
| C23C 16/06  | (2006.01) |
| C23C 16/22  | (2006.01) |

(52) U.S. Cl.
USPC ............... 118/719; 156/345.22; 156/345.31; 156/345.32; 156/345.33; 118/715

(58) Field of Classification Search
USPC ............... 118/719, 715; 156/345.22, 345.31, 156/345.32, 345.33
See application file for complete search history.

(56) References Cited

U.S. PATENT DOCUMENTS

| 4,266,507 | A | * | 5/1981 | Satoh | 118/733 |
| 4,312,294 | A | * | 1/1982 | Satoh | 118/733 |
| 4,348,580 | A |   | 9/1982 | Drexel |  |
| 4,592,307 | A | * | 6/1986 | Jolly  | 118/719 |
| 4,640,223 | A | * | 2/1987 | Dozier | 118/719 |

(Continued)

FOREIGN PATENT DOCUMENTS

| DE | 3702734 C1 | 10/1987 |
| EP | 1393351 A1 | 3/2004 |

(Continued)

*Primary Examiner* — Rudy Zervigon
(74) *Attorney, Agent, or Firm* — Heslin Rothenberg Farley & Mesiti P.C.

(57) ABSTRACT

A device for doping, deposition or oxidation of semiconductor material at low pressure in a process tube, is provided with a tube closure as well as devices for supplying and discharging process gases and for generating a negative pressure in the process tube. A closure of the process chamber that is gas tight with respect to the process gases and the vacuum tight seal of the end of the tube closure are spatially separated from each other in relation to the atmosphere and are arranged on a same side of the process tube in such a manner that a bottom of a stopper, sealing the process chamber, rests against a sealing rim of the process tube and the tube closure end is sealed vacuum tight by a collar, which is attached to the process tube and against which a door rests sealingly.

26 Claims, 4 Drawing Sheets

U.S. PATENT DOCUMENTS

| | | | |
|---|---|---|---|
| 4,747,368 A | 5/1988 | Brien et al. | |
| 4,793,283 A | 12/1988 | Sarkozy | |
| 4,943,235 A * | 7/1990 | Nakao et al. | 432/205 |
| 4,991,540 A * | 2/1991 | Jurgensen et al. | 118/715 |
| 5,044,314 A * | 9/1991 | McNeilly | 118/715 |
| 5,050,534 A | 9/1991 | Yates | |
| 5,088,444 A * | 2/1992 | Ohmine et al. | 118/719 |
| 5,118,286 A * | 6/1992 | Sarin | 432/2 |
| 5,133,561 A | 7/1992 | Hattori et al. | |
| 5,154,730 A * | 10/1992 | Hodos et al. | 29/25.01 |
| 5,223,001 A * | 6/1993 | Saeki | 29/25.01 |
| 5,232,508 A * | 8/1993 | Arena et al. | 118/719 |
| 5,329,095 A * | 7/1994 | Okase | 219/390 |
| 5,433,784 A * | 7/1995 | Miyagi et al. | 118/715 |
| 5,484,483 A * | 1/1996 | Kyogoku | 118/719 |
| 5,567,149 A * | 10/1996 | Hansotte et al. | 432/6 |
| 5,571,330 A * | 11/1996 | Kyogoku | 118/719 |
| 5,578,132 A * | 11/1996 | Yamaga et al. | 118/724 |
| 5,772,833 A * | 6/1998 | Inazawa et al. | 156/345.47 |
| 6,027,569 A | 2/2000 | Brown | |
| 6,101,844 A * | 8/2000 | Fowler et al. | 65/41 |
| 6,183,564 B1 * | 2/2001 | Reynolds et al. | 118/719 |
| 6,534,748 B1 | 3/2003 | Zinman et al. | |
| 6,551,044 B1 * | 4/2003 | Stevens | 414/217 |
| 6,716,288 B2 | 4/2004 | Tognetti | |
| 6,741,804 B2 | 5/2004 | Mack et al. | |
| 6,752,874 B2 * | 6/2004 | Shim et al. | 118/719 |
| 7,267,725 B2 * | 9/2007 | Kawano | 118/719 |
| 7,273,819 B2 | 9/2007 | Oosterlaken et al. | |
| 7,276,123 B2 * | 10/2007 | Shimizu et al. | 118/719 |
| 7,314,526 B1 | 1/2008 | Preti et al. | 118/715 |
| 7,452,423 B2 * | 11/2008 | Kim et al. | 118/719 |
| 7,524,532 B2 * | 4/2009 | Jurgensen et al. | 427/248.1 |
| 7,524,745 B2 | 4/2009 | Pellegrin | |
| 7,670,432 B2 * | 3/2010 | Li | 118/715 |
| 7,740,705 B2 * | 6/2010 | Li | 118/715 |
| 7,794,546 B2 * | 9/2010 | Li | 118/733 |
| 8,293,014 B2 * | 10/2012 | Kurokawa | 118/715 |
| 2002/0148054 A1 * | 10/2002 | Drake | 8/509 |
| 2004/0060519 A1 | 4/2004 | Beauchaine et al. | |
| 2005/0022737 A1 * | 2/2005 | Shimizu et al. | 118/715 |
| 2005/0106319 A1 * | 5/2005 | Jurgensen et al. | 427/248.1 |
| 2006/0105107 A1 | 5/2006 | Lindeboom et al. | |
| 2007/0080156 A1 * | 4/2007 | Seo et al. | 219/383 |
| 2007/0116872 A1 * | 5/2007 | Li et al. | 427/248.1 |
| 2007/0116873 A1 * | 5/2007 | Li et al. | 427/248.1 |
| 2007/0157683 A1 * | 7/2007 | Li | 70/209 |
| 2007/0209588 A1 * | 9/2007 | Li | 118/715 |
| 2007/0209590 A1 * | 9/2007 | Li | 118/719 |
| 2007/0212484 A1 * | 9/2007 | Li | 427/248.1 |
| 2008/0292430 A1 * | 11/2008 | Piechulla et al. | 414/147 |
| 2009/0178620 A1 * | 7/2009 | Juergensen et al. | 118/725 |
| 2011/0170989 A1 * | 7/2011 | Aburatani et al. | 414/161 |
| 2012/0315404 A1 * | 12/2012 | Li et al. | 427/569 |
| 2013/0025539 A1 * | 1/2013 | Piechulla et al. | 118/724 |

FOREIGN PATENT DOCUMENTS

| | | | |
|---|---|---|---|
| JP | 1046918 A1 | | 2/1989 |
| JP | 2573614 B2 | | 2/1989 |
| JP | 1-198034 A | | 8/1989 |
| JP | 5082460 A1 | | 4/1993 |
| JP | 2003183830 A | * | 7/2003 |
| JP | 2003309078 A | * | 10/2003 |
| JP | 2005285941 A1 | | 10/2005 |

* cited by examiner

DEVICE FOR DOPING, DEPOSITION OR OXIDATION OF SEMICONDUCTOR MATERIAL AT LOW PRESSURE

CROSS REFERENCE TO RELATED APPLICATIONS

This application is a continuation of application Ser. No. 12/124,445 filed on May 21, 2008, now abandoned, and claims priority of German application No. 10 2007 023 812.8 filed on May 21, 2007, and German application No.: 10 2007 063 363.9, filed on Dec. 28, 2007, the entire disclosure of these applications being hereby incorporated herein by reference.

BACKGROUND ART

The invention relates to a device for doping, deposition or oxidation of semiconductor material at low pressure in a process tube, which is provided with a tube closure as well as with devices for supplying and discharging process gases and for generating a negative pressure in the process tube.

In comparison to diffusion at atmospheric pressure, diffusion at low pressure makes it possible, as well known, to decrease the spacing between the wafers and, thus, to load the process tube with a higher number of silicon disks while simultaneously retaining or improving the homogeneity of the doping operation. The prerequisite is that it must be possible to evacuate the process tube or the furnace, which has to be vacuum tight, so that an adequately low processing pressure is reached. For example, a processing pressure of about 200 mbar may be regarded as an adequately low processing pressure.

Furthermore, the output and reaction products may not come into contact with materials that would be attacked thereby; and these products may not accumulate in this reaction tube/furnace.

The past prior art devices (for example, EP 1 393 351 A1) for phosphorus doping at low pressure with phosphorychloride as the dopant exhibit considerable problems. For example, a condensation of phosphorus oxide occurs on the surfaces and, in particular, in the region of the tube closure as well as on the end of the process tube, to which a pump is connected, and also in the waste gas zone between the process tube and the pump as well as in the pump itself. The reason lies in the fact that the temperature in these regions is significantly lower than the processing temperature.

The contact with water, in particular of atmospheric humidity following aeration of the device with pure nitrogen and pure oxygen upon opening the tube closure causes the phosphorus oxide to convert into phosphoric acid. The fatal consequences are corrosion of the metallic components of the device, such as the tube closure, and the subsequent contamination of the process tube with the corrosion products and the contamination of the products, which are processed in the device, for example due to the iron contamination in silicon.

Furthermore, there is the risk that the phosphoric acid will escape from the process tube or that the reaction products may accumulate in the process tube and the components of the device that are connected to said process tube. The components that are connected to the process tube may coalesce; and there is the risk of decomposition of the process tube and the components that are connected to said process tube. Finally the accumulation may unfold an undesired doping effect.

Moreover, the reaction products, like chlorine, hydrochloric acid, phosphorus oxide and phosphoric acid, may cause corrosion, including quartz corrosion.

In a device of the "cantilever" construction the paddle stays in the process tube during the process, is consequently heated to the processing temperature and is then removed again at a high temperature after the end of the process. For example, in the cantilever design the rear end of the paddle exhibits a cylinder, the surface of which is enveloped by a sealing ring.

The invention is based on the problem of providing a device for doping, deposition and oxidation of semiconductor material at low pressure in a process tube. With this device the aforementioned drawbacks are to be avoided.

BRIEF SUMMARY OF THE INVENTION

This object is achieved in that a closure of the process chamber that is gas tight with respect to the process gases and the vacuum tight seal of the end of the tube closure are spatially separated from each other in relation to the atmosphere and are arranged on the same side of the process tube in such a manner that the bottom of a stopper, sealing the process chamber, rests against a sealing rim of the process tube and that the vacuum tight sealing of the tube closure end is carried out by means of a collar, which is attached to the process tube and against which a door rests sealingly.

Thus, the object concerns a two step closure of the process tube, comprising a gas tight high temperature closure with a low leak rate and a vacuum tight closure.

The collar projects beyond the process tube on the face side so that inside the collar there is a collar chamber, which can be closed outwardly in a vacuum tight manner by means of the door.

The vacuum tight sealing of the tube closure with the door takes place with the interposition of a seal, which can be applied to the collar on the face side.

The stopper is made preferably of quartz, SiC or any other suitable material that is adequately stable to temperature and resistant to mediums or is coated with such a material and is attached in a detachable and spring loaded manner to the inside of the door so that it is possible to replace said stopper with ease.

The stopper is attached to the door ideally with a bayonet closure.

In order to achieve a door design that is as lightweight as possible, the door is fabricated of aluminum or another light metal.

One special advantage of the inventive two step seal lies in the fact that the door may be designed so as to be water cooled without thereby affecting the processing temperature in the process chamber. Therefore, in addition, a door seal can be achieved with thermoplastic or flexible materials.

For this purpose the door is provided with a cooling water inlet and a cooling water outlet for the through passage of a coolant. In this case the coolant is distributed by means of a ring-shaped groove in the door.

In order to be able to fill the collar chamber with flushing gas, the door is provided with a flushing gas inlet for introducing a flushing gas into the collar chamber and exhibits a flushing gas outlet/pump-out connector. The flushing gas outlet/pump-out connector may be connected to a separate pump.

A simpler construction is characterized in that the flushing gas outlet is connected by way of a hose line to a gas conveying tube and a pump for pumping the flushing gas out of the chamber and simultaneously the process gases out of the process chamber.

The flushing gas inlet is connected to a source for nitrogen or another suitable gas.

In order to prevent the process gas fractions from escaping into the collar chamber, the collar chamber exhibits an overpressure in relation to the process chamber in the process tube.

The pressure differential ranges from zero to approximately 50 mbar.

In order to evacuate the process chamber and the collar chamber and in order to simultaneously generate the pressure differential between the process chamber and the collar chamber, it is practical to provide a common pump.

Another embodiment of the invention provides for the purpose of generating the pressure differential that the connection of the collar chamber to the pump is designed with a line that is long in comparison to the process tube extraction and exhibits a smaller cross section.

In order to reduce the load on the pump, a cooling trap is disposed upstream of the pump; and the extracted process gases and flushing gases are cooled in said cooling trap.

The pump may be designed as a diaphragm pump, screw pump or jet pump—that is, as a liquid jet pump.

Furthermore, in order to form the pressure differential a suitable leak rate of the contact point of the quartz stopper and the sealing rim of the process tube is set by a flat finish of the surfaces that meet.

In another embodiment of the invention the process gas outlet for carrying away the process gases is disposed on the end of the process tube that lies opposite the tube closure.

The process gas outlet is provided preferably with a spherically ground joint in order to guarantee, on the one hand, an adequate tightness and, on the other hand, a certain leakiness so that it is guaranteed that the connecting point will be flushed by the surrounding air that is sucked in. Thus, this process prevents with certainty any process gas residues from being able to settle out.

The process gas outlet may be configured so as to be either downwardly sloped or horizontal.

Preferably the process gas outlet is sloped downwardly by approximately 5 degrees.

Furthermore, the spherically ground joint on the gas outlet is configured for the attachment and for the through passage of a gas outlet lance.

The collar chamber is evacuated by means of the gas conveying tube via a T-piece, through which the gas conveying tube is run.

For the process gas inlet into the process chamber a coaxial tube is provided as the component of a gas inlet lance on the side of the process gas outlet that extends up to the quartz stopper on the other side of the process tube without touching said stopper.

BRIEF DESCRIPTION OF THE DRAWING FIGURES

The invention is explained below in detail by means of one embodiment. In the related drawings.

DETAILED DESCRIPTION

Figure 1:
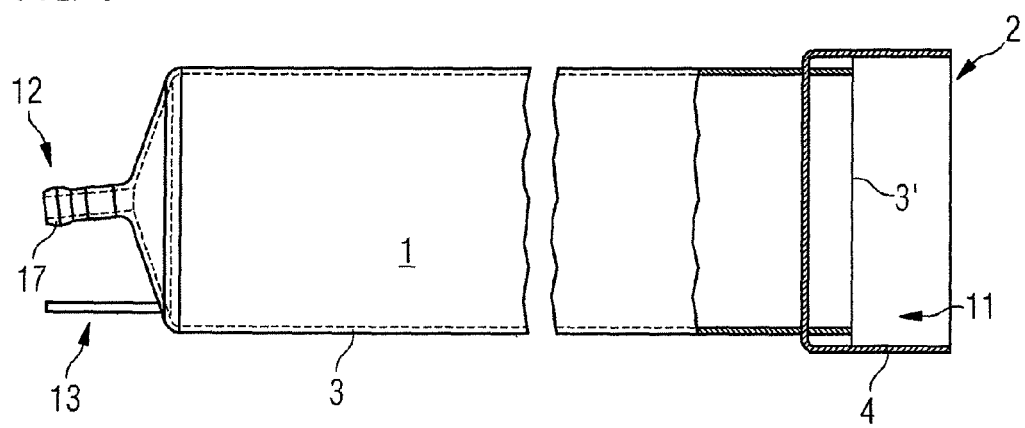
FIG. 1 is a schematic rendering of an inventive process tube with extraction and gas inlet (on the left in the drawing).
Figure 2:
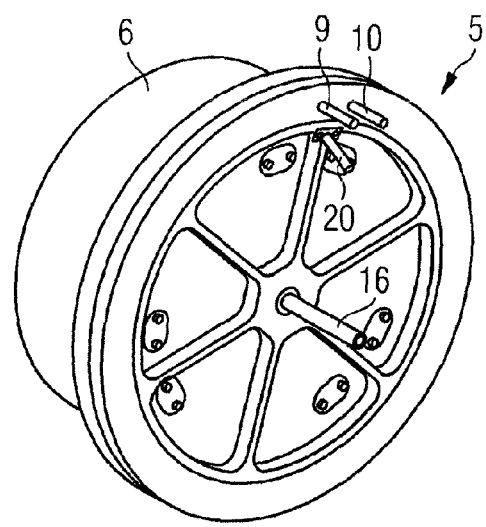
FIG. 2 is a perspective view of a door for closing the process tube, according to FIG. 1.
Figure 3:
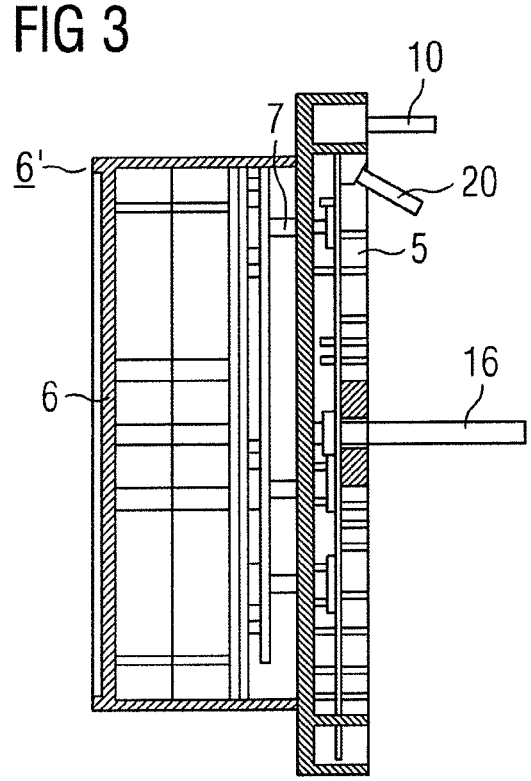
FIG. 3 is a side view of the port with the quartz stopper.
Figure 4:
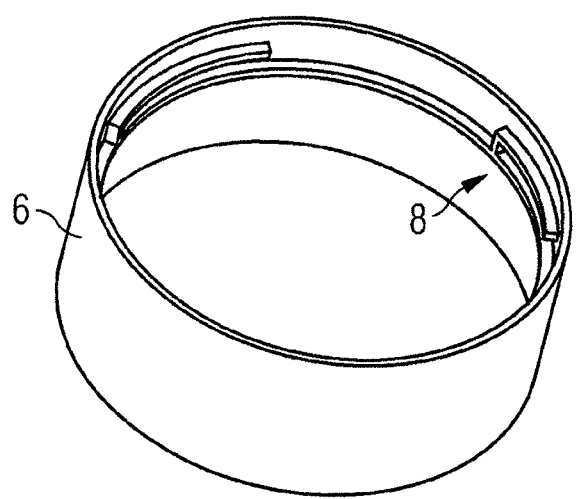
FIG. 4 depicts a detail of a bayonet closure on the inside of the quartz stopper.

The core of the invention is that the closure of the process chamber 1 to the surrounding atmosphere and the seal of the tube closure end 2 are designed so that they are spatially separated from each other in a coaxial or successive arrangement. The process tube 3, which is made of quartz, exhibits a collar 4 on the tube closure end 2. That is, the process tube exhibits a coaxial tubular segment, which is glass sealed onto the inner tube, thus, on the process tube 3, and projects a ways beyond said tube (FIG. 1). The collar 4 is glass sealed onto the process tube 3 or attached elsewhere and, in addition, may be enveloped by insulating material (not illustrated). The tube closure itself is designed in two steps and comprises a door 5 made of metal for the purpose of ensuring the vacuum tightness. Attached to this door is a "sunk" stopper made of quartz (quartz stopper 6) (FIGS. 2-4). In the closed state of the door 5 the rim of the bottom of the quartz stopper 6 rests in a spring loaded manner against the sealing rim 3' of the process tube 3. The stopper is made of quartz, SiC and/or another material that is adequately temperature stable and medium resistant. The stopper may also be coated with one of these materials or additionally coated.

Figure 7:
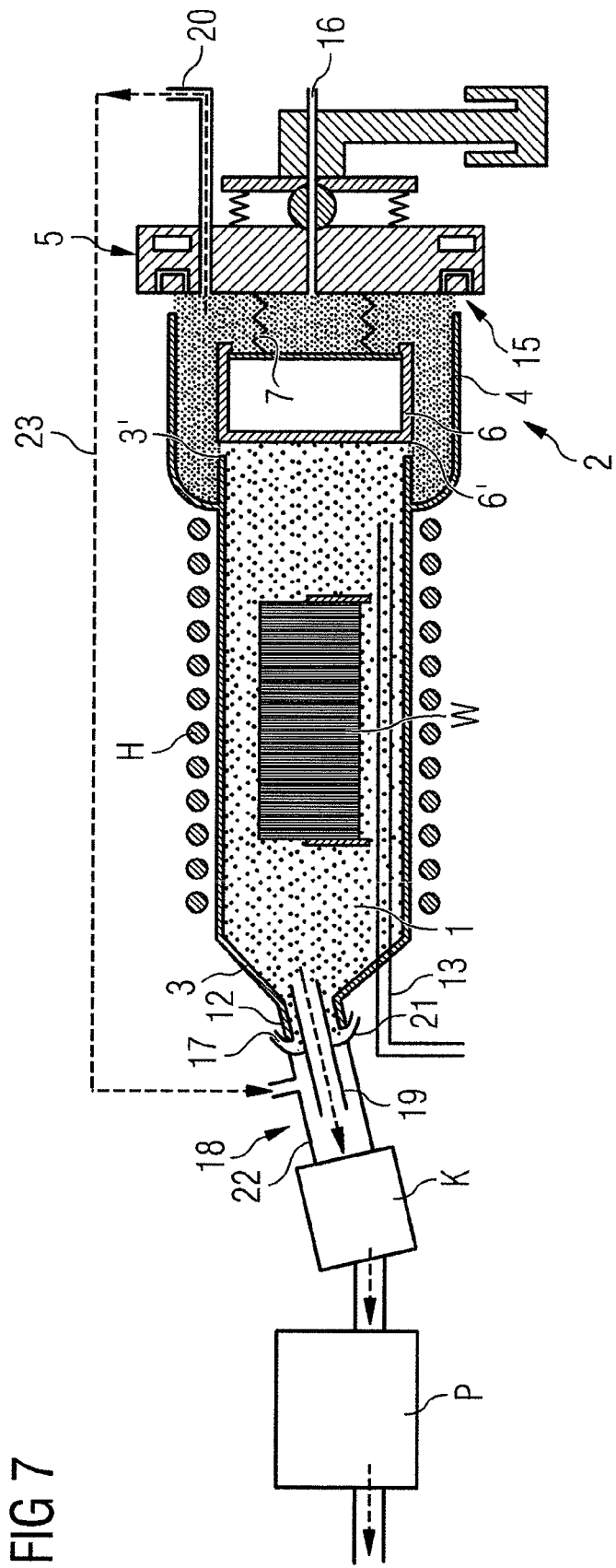
FIG. 7 is a schematic drawing of an overview of the inventive device.

In the open state, that is, when the door 5 is open, the tube closure end 2 is used to move in and out the semiconductor material, which is set side by side or stacked in a boat and which has the form of wafers W or the like, which are to be treated in the process chamber 1 (FIG. 7).

The interior of the quartz stopper 6 is filled with an insulating material, like shaped parts made of ceramic fibers, plates or loose wool on the basis of aluminum silicate fibers. The quartz stopper may have an opaque bottom. The filling with the insulating material serves to generate a temperature gradient in the direction of the door 5, in such a manner that the temperature decreases from the bottom of the quartz stopper 6 in the direction of the door 5.

The quartz stopper 6 is fastened to the door 5 of the tube closure with a plurality of spring elements 7 (FIGS. 3, 7). The spring elements 7 may be made of stainless steel or another material that is adequately temperature stable.

The spring force of the spring elements 7, that is, the force with which the bottom of the quartz stopper 6 can be applied to the sealing rim 3' of the process tube 3, may be adjusted from the outside by means of screws or other setting means that are covered in a vacuum tight manner when the process tube 3 is operating. For example, stainless steel springs are used as the spring elements.

The interior of the cylinder of the quartz stopper 6 exhibits a bayonet closure 8 on the side facing the door 5 (FIG. 4). The corresponding counter-piece on the door 5 is made of stainless steel. The bayonet closure 8 is secured and clamped with the aid of a quartz cord (not illustrated). Therefore, if necessary, the quartz stopper 6 may be quickly replaced.

The outer door 5 of the tube closure is made of aluminum and is water cooled. To this end the interior exhibits boreholes and channels, through which the cooling fluid flows. Furthermore, the door 5 exhibits a cooling water inlet 9 and a cooling water outlet 10. In this case the cooling water is distributed over a ring-shaped groove in the door 5 (FIGS. 2, 3). In addition, a pressure sensor may be attached to the door 5. The pressure in the collar chamber 11 can be measured with this pressure sensor.

Figure 5:
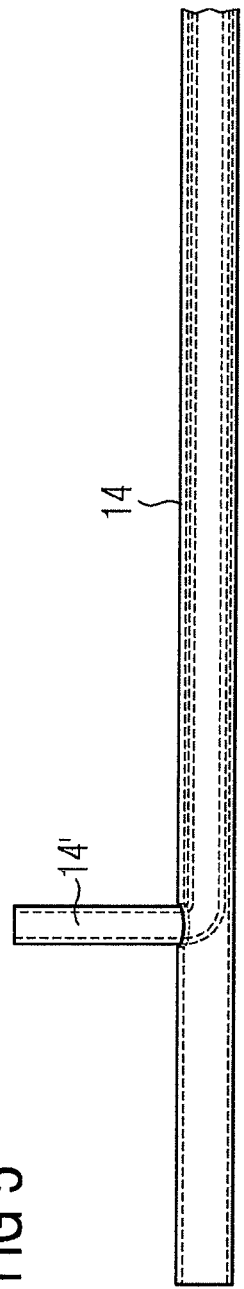
FIG. 5 depicts a coaxial gas inlet tube for the gas inlet into the process tube, according to FIG. 1.
Figure 6:
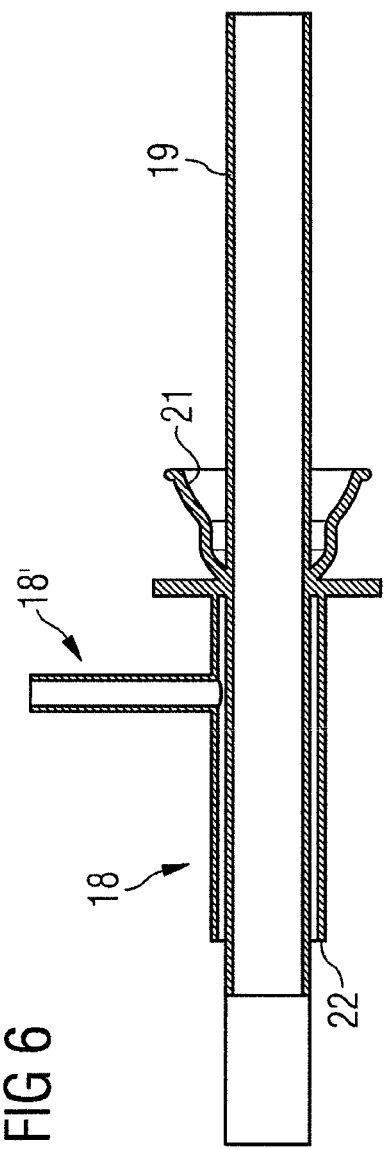
FIG. 6 depicts a detail of a gas outlet lance for the evacuation of the process tube, according to FIG. 1.

The process tube 3 is surrounded by a heating unit H (FIG. 7) and insulation (not illustrated). Furthermore, the left end of the process tube 3 (as shown in the drawing) is provided with a central process gas outlet 12 in the form of an intake manifold for pumping out the process gases (FIGS. 1, 6). Under said process gas outlet is located a plurality of pipe connections 13, into which a quartz lance with a thermoelement as well as the necessary gas inlet lances (coaxial tube 14, FIG. 5) can be inserted. The gas inlet lances may be designed so long that they extend almost as far as to the bottom of the quartz stopper 6 on the side of the process tube 3 that is depicted on the right in the drawing (FIG. 7). A coaxial tube 14 may also be used for the gas inlet. The process gases may be conveyed by choice through the inner tube 14' and the outer tube 14 into said coaxial tube (FIG. 6).

The process gas is admitted via one pipe connection 13 and is conveyed to the opposite end of the process tube 3. From there the process gas flows to the other end of the process tube 3, where it is extracted by means of a central nozzle—the process gas outlet 12.

For a vacuum tight closure of the process tube 3, the door 5 is pushed with a seal 15 against the face rim of the collar 4. Internally the ground rim 6' of the quartz stopper 5 pushes in a spring loaded manner so as to seal against the sealing rim 3' of the process tube 3 so that the process chamber 1 is surrounded in its entirety by quartz and simultaneously is closed in a vacuum tight manner (FIGS. 3, 7).

For flushing and evacuating the tube closure, for example, with nitrogen, the door 5 is provided with a flushing gas inlet 16 and a flushing gas outlet 20. The flushing gas outlet 20 serves simultaneously as the pumping-out connector (FIG. 3), with which the region—collar and quartz stopper and door (that is the collar chamber 11)—can be evacuated.

Upon loading the process tube 3 and closing the door 5, the flushing gas inlet and outlet 16, 20 are used for flushing out the air and during low pressure application for flushing out the reaction products that have diffused into the collar chamber 11.

During the process, the collar chamber 11 is flushed with nitrogen so that an overpressure in relation to the process chamber 1 is formed in the process tube 3. In this way the output products and the reaction products are prevented from issuing from the process chamber 1 as far as up to the door 5 that is made of metal (FIGS. 2, 7).

A pressure differential of, for example, 50 mbar, should prevail between the process chamber 1 and the collar chamber 11. However, the pressure difference may not be too great, since, otherwise, the bottom of the quartz stopper 6 may break. In this case a higher strength may offer a bottom of the quartz stopper 6 that is arched in the direction of the process chamber 1.

The overpressure in the collar chamber 11 helps push the quartz stopper 6 against the process tube 3. The unavoidable leakage between the quartz stopper 6 and the process tube 3, that is, between the ground sealing rim 3' and the ground rim 6', may lead to an undesired flushing effect at this point.

The evacuation of the process chamber 1 and the collar chamber 11 is carried out with the same pump P with simultaneous generation of a pressure differential between the process chamber 1 and the collar chamber 11. In this case a suitable pump P is a diaphragm pump and/or a screw pump or a jet pump. A cooling trap K may be disposed upstream of the pump P for its protection. At the same time a decrease in the waste gas and liquid downstream of the pump P is achieved (FIG. 7).

For the purpose of generating the pressure differential, the connection of the pumping-out connector 20 of the collar chamber 11 to the pump P is carried out with a line 23 which is long in comparison to the process tube extraction and which exhibits a small cross section (FIG. 7). The suction capacity, which is decreased to such an extent owing to the line 23, for example a hose line, makes it possible to generate the desired pressure differential between the process chamber 3 and the collar chamber 11 at a low nitrogen flow rate. The prerequisite for the evolution of this pressure differential is a suitable leakage rate of the contact point of the quartz stopper 6 and the process tube 3, a feature that can be achieved by means of a flat finish of the surfaces that touch each other (sealing rim 3' and rim 6').

The necessary process gas outlet 12 from the process chamber 1 in the form of an intake manifold is located in the middle of the process tube 3 on the side opposite the tube closure 2 and is provided with a spherically ground joint 17 and is either sloped downwardly, for example, 5 degrees or configured horizontally (FIGS. 1, 7). The advantage of the downwardly sloped process gas outlet 12 lies in the fact that the liquid reaction products or the reaction products that liquefied upon aeration of the device and the deposits, like phosphoric acids, may flow away. As a result the process gas outlet 12 is prevented from clogging. Furthermore, the object is achieved that as few substances as possible can bind that can influence the process results.

A special gas outlet lance 18 (FIG. 6), which is made of quartz, SiC or another suitable material, may be clamped, for example, in a spring loaded manner, to the spherically ground joint 17 (FIGS. 1, 7). The gas outlet lance 18 is inserted with a gas conveying tube 19 into the outlet 12 of the process tube 3 (FIGS. 1, 7) and sealed with a spherically ground joint 21. A T-piece 18' is connected to the pumping-out connector 20 of the door 5 via a hose 23 (FIG. 7). In this case an outer tube 22 of the T-piece 18' surrounds the gas conveying tube 19 at a predefined distance. Basically a conically ground joint or even a screw connection can also be used, instead of the spherically ground joint 17.

The gas outlet lance 18 fulfills a plurality of functions. First of all, this function would be the evacuation of the process chamber 1 through the tube 19, which is situated internally and which extends into the process chamber 1, so that substances from the process chamber 1, like phosphoric acid, do not flow past the spherically ground joint 17, 21 of the process gas outlet 12 and, thus, cannot settle there.

Furthermore, the spherically ground joint 17, 21 is flushed with ambient air by means of a design-induced leakage of the spherically ground joint 17, 21, so that owing to the pressure differential a little air always gets in from the outside.

The gas, which flows from the collar chamber 11 through the T-piece 18 into the outer tube 22, insulates this gas thermally from the inner tube, conveying the hot waste gases (gas conveying tube 19), so that the outer tube 22 can be attached to the additional waste gas line with a thermoplastic seal.

Finally the gas conveying tube 19, which is situated internally and which exhibits the extracted process gases, is thermally insulated by means of the gas flowing in the outer tube 22. In addition, the inner tube 22 may also be heated in order to avoid condensation phenomena.

Therefore, owing to the invention a process pressure of, for example, 50 mbar—thus, far below 200 mbar—can be run. Oxygen, nitrogen and $POCl_3$ with nitrogen as the carrier gas are used as the process gases.

Essential for the invention is, on the one hand, the spatial separation of the two seals for the process chamber 1 and the door 5 and that the seal and the wall, that is, the bottom of the quartz stopper 6, which seals the process chamber 1, are located as near as possible to the heated region of the process tube 3 and, as a result, exhibit a temperature near the process temperature. In this way the condensation of the process gases and their reaction products and their reactions, which run at the walls at an adequately low temperature, in particular the settling out of the phosphorus oxide, in the process chamber 1, is avoided.

Owing to the spatial separation the seal, which provides for the vacuum tightness, which is necessary for reaching the desired process pressure, may be attached adequately far away and owing to the insulation and thermal radiation protection shielded from the heated region of the process tube 3. The seal 15 and the door 5 may be actively cooled without any negative effects on the process and the process chamber. As a result, the temperature at the vacuum seal 15 and the door 5 is significantly lower than the process temperature, a state that makes it possible to use suitable materials for the seal 15 between the process tube (made, for example, of quartz) and the door (made, for example, of aluminum)—in this case, made of silicone and PTFE and for the door 5 itself (for example aluminum). An adequately cold door 5 is also a prerequisite for attaching the hoses, for example, hose 23, and for the additional function of the mechanics for actuating the door, as well as for the thermal dynamics of the system that is altogether appropriate.

The core of the inventive device for doping, deposition and oxidation of semiconductor material or other substrates at low pressure is the vacuum suitable closure of the process tube 3 with two "gas tight" seals. The first seal is a spring loaded, ground quartz-quartz seal between the sealing rim 3' of the process tube 3 and the ground rim 6' of the quartz stopper 6. This seal is temperature stable and, thus, can seal the process chamber 1 at a very hot point. In this way a condensation of the process gases can be prevented with certainty.

Such a seal is only conditionally tight, that is, at high differential pressures there is a relatively high leak rate; and this seal can be designed pressure-proof only with effort. The maximum differential pressure is about 1 bar. Beyond this amount a very thick quartz plate has to be used, but the risk of a fracture still remains.

Both problems are solved by means of the inventive second seal between the rim of the door 5 and the face rim of the collar 4, thus a flexibly sealing metal-quartz seal. Since such a seal is not stable to corrosion, the collar chamber 11 is flushed through the door 5 with a flushing gas, for example, nitrogen, as described above.

The invention claimed is:

1. Device for doping, deposition or oxidation of semiconductor material at low pressure in a process chamber of a process tube, comprising: devices arranged at a first end of the process tube for supplying and discharging process gases and for generating a negative pressure in the process tube, a collar attached to the process tube at a tube closure end opposite the first end, the collar comprising a coaxial tubular segment projecting beyond a sealing rim of the process tube and terminating in an outer rim, a stopper for closing the process chamber, said stopper being adapted to rest against the sealing rim of the process tube with a given leakage rate, and a door for vacuum tight sealing of the tube closure end, said door being applied to the outer rim of the collar with interposition of a seal, and the stopper being attached in a detachable and spring loaded manner to an inside of the door.

2. Device, as claimed in claim 1, wherein the collar encircles a collar chamber, and the collar chamber is closed in a vacuum tight manner by the door.

3. Device, as claimed in claim 1, wherein the stopper is attached to the door by a bayonet closure.

4. Device, as claimed in claim 1, wherein the stopper is made of quartz, SiC or another material that is adequately temperature stable and medium resistant to close the process chamber.

5. Device, as claimed in claim 1, wherein the stopper is coated with quartz, SiC or another material that is adequately temperature stable and medium resistant to close the process chamber.

6. Device, as claimed in claim 1, wherein the door comprises aluminum.

7. Device, as claimed in claim 6, wherein the door is water cooled.

8. Device, as claimed in claim 7, wherein the door has a cooling water inlet and a cooling water outlet for through passage of a coolant.

9. Device, as claimed in claim 8, wherein the door has a ring-shaped groove for distribution of the coolant.

10. Device, as claimed in claim 2, wherein the door has a flushing gas inlet for introducing a flushing gas into the collar chamber and includes a flushing gas outlet.

11. Device, as claimed in claim 10, wherein the flushing gas outlet is connected by a hose line to a gas conveying tube and a pump for pumping the flushing gas out of the collar chamber and for pumping the process gases out of the process chamber.

12. Device, as claimed in claim 11, wherein the flushing gas inlet is connected to a source of nitrogen.

13. Device, as claimed in claim 2, wherein the collar chamber exhibits an overpressure in relation to the process chamber in the process tube.

14. Device, as claimed in claim 13, wherein a pressure differential between the collar chamber and the process chamber ranges from zero to approximately 50 mbar.

15. Device, as claimed in claim 2, further comprising a common pump for evacuating the process chamber and the collar chamber and for generating a pressure differential between the process chamber and the collar chamber.

16. Device, as claimed in claim 15, further comprising a line connecting the collar chamber to the pump, the line having a larger length and smaller cross section in comparison to a process gas outlet tube to generate said pressure differential.

17. Device, as claimed in claim 15, further comprises a cooling trap disposed upstream of the pump.

18. Device, as claimed in claim 15, wherein the pump comprises a diaphragm pump, screw pump or jet pump.

19. Device, as claimed in claim 16, wherein, a contact area of the stopper and the sealing rim of the process tube comprise flat finished surfaces that meet and define the given leak rate.

20. Device, as claimed in claim 1, wherein the device for discharging process gases includes a process gas outlet for carrying away the process gases located on the first end of the process tube.

21. Device, as claimed in claim 20, wherein the process gas outlet includes a spherically ground joint.

22. Device, as claimed in claim 20, wherein the process gas outlet is either downwardly sloped or horizontal.

23. Device, as claimed in claim 22, wherein the process gas outlet is sloped downwardly by approximately 5 degrees.

24. Device, as claimed in claim 22, wherein the process gas outlet includes a spherically ground joint configured for attachment and for through passage of a gas outlet lance.

25. Device, as claimed in claim 2, further comprising a T-piece for evacuating the collar chamber, and a process gas conveying tube extending through a portion of the T-piece.

26. Device, as claimed in claim 1, wherein the device for supplying process gases includes a process gas inlet extending into the process chamber, and a gas inlet lance that extends as far as up to the stopper without touching said stopper.

* * * * *

UNITED STATES PATENT AND TRADEMARK OFFICE
CERTIFICATE OF CORRECTION

| | | |
|---|---|---|
| PATENT NO. | : 8,460,468 B2 | Page 1 of 1 |
| APPLICATION NO. | : 13/564126 | |
| DATED | : June 11, 2013 | |
| INVENTOR(S) | : Piechulla et al. | |

It is certified that error appears in the above-identified patent and that said Letters Patent is hereby corrected as shown below:

On the Title Page

In the Related U.S. Application Data (63): Delete "Continuation of application No. 12/124,445," and insert -- Continuation of application No. 12/124,455 --

Signed and Sealed this
Fourth Day of March, 2014

Michelle K. Lee
*Deputy Director of the United States Patent and Trademark Office*